United States Patent [19]

Becker

[11] Patent Number: 4,933,812
[45] Date of Patent: Jun. 12, 1990

[54] PACKAGE AND CIRCUIT ARRANGEMENT FOR HOUSING AND CONNECTING POLARIZED ELECTRICAL COMPONENTS AND METHOD OF MANUFACTURE

[75] Inventor: James D. Becker, Meridian, Id.

[73] Assignee: Hewlett-Packard Company, Palo Alto, Calif.

[21] Appl. No.: 420,080

[22] Filed: Oct. 11, 1989

[51] Int. Cl.$^5$ .............................................. H01G 9/00
[52] U.S. Cl. .................................................... 361/540
[58] Field of Search ................ 354/288; 361/272, 275, 361/402, 404, 405, 406, 409, 410, 417, 418, 535, 538, 540, 306

[56] References Cited

U.S. PATENT DOCUMENTS

| 4,539,623 | 9/1985 | Irikura et al. | 361/540 |
| 4,712,898 | 12/1987 | Haraguchi | 354/288 |
| 4,727,456 | 2/1988 | Mehta et al. | 361/417 |

FOREIGN PATENT DOCUMENTS 483774  2/1970  Switzerland .................... 361/409

Primary Examiner—Donald A. Griffin

[57] ABSTRACT

A package and circuit arrangement having rotational symmetry wherein positive and negative terminals are connected on both opposite ends of the package and also connected to an electrical component within the package. The positive terminals are diagonally aligned with respect to an axis of symmetry for the package, and the negative terminals are also diagonally aligned with respect to this axis of symmetry. Thus, the component within the package is always properly biased when the package is inserted into a circuit board receptacle having positive and negative terminals which are matched in position and polarity with those of package regardless of planar orientation of the package on the receiving surface of the circuit board.

9 Claims, 2 Drawing Sheets

PACKAGE AND CIRCUIT ARRANGEMENT FOR HOUSING AND CONNECTING POLARIZED ELECTRICAL COMPONENTS AND METHOD OF MANUFACTURE

FIELD OF THE INVENTION

This invention relates generally to the packaging of small electronic components and more particularly to a component package and associated circuit arrangement which assures the fail safe connection of polarized components into facing receptacles on circuit boards and the like.

BACKGROUND ART

Certain polarized electrical components, such as tantalum capacitors, diodes and other PN junction devices are normally constructed so as to have a single positive terminal located at one end of the component and a single negative terminal located at the other end of the component. This choice of terminal designation is determined by the internal polarity of the material within the component proper. When the positive and negative terminals of the electrical component are connected respectively to the energized positive and negative leads on a printed circuit board, the polarized component becomes electrically charged in the desired or forward direction. However, when the polarized component becomes charged in the incorrect or reverse direction, component breakdown, shorting, circuit failure, fire or all of the above will sometimes occur within a certain time after the component has been energized. Thus, there is a requirement that these polarized electrical components be placed at the correct orientation within the plane of the electrical circuit board receiving the polarized components. This problem has been previously discussed in the prior art such as, for example, in Parson's U.S. Pat. No. 4,027,207 assigned to IBM and incorporated herein by reference.

A rapidly growing technology in which this correct orientation and biasing of small electronic components is required is that known as surface-mount technology (SMT). Using this technology, both electrical components and conductive traces for making connections thereto are installed on the same side of a substrate surface. For a further discussion of some of the fundamentals of this technology, reference may be made to an article by F. M. Mims, III entitled "Introduction to Surface Mount Technology", *RadioElectronics*, November 1987, pp 59–70 or to U.S. Pat. No. 4,722,470 assigned to IBM. Both of these publications are also incorporated herein by reference.

Once the above components have been mounted in a particular orientation on a printed circuit board, or as part of a surface-mounted device, or both, they are electrically tested to see if they are forward biased in the correct forward polarized direction. This testing requirement adds time and expense to the printed circuit board assembly process, and in the specific case of polarized tantalum capacitors, electrical testing is usually ineffective in identifying an incorrect reversed polarity condition. That is, component breakdown and failure do not usually occur until a certain time has elapsed after reverse bias is improperly applied thereto.

DISCLOSURE OF INVENTION

A general object of this invention is to eliminate the above requirement for a specific orientation of polarized components within their receiving receptacles. This novel approach allows polarized components as well as non-polarized components to be mounted in either of two acceptable planar orientations within a facing receptacle. By eliminating this specific orientation requirement and by eliminating the corresponding requirement to test for this orientation, this invention reduces the time and cost associated with printed circuit board assembly and testing. In the specific case of electrolytic capacitors where electrical testing is ineffective in determining a reversed polarity condition, this invention eliminates the risk of fire due to catastrophic failure of the reversed part. Thus, secondary damage liability risk for electrical/electronic equipment manufacturers is eliminated. The present invention also simplifies the design of printed circuit boards by providing multiple redundant electrical terminations of the polarized components.

To accomplish the above, I have developed a novel electrical component package suitable for housing both polarized and non-polarized components and a method for manufacturing same. The package includes a main body having first and second opposed spaced apart surfaces operative for connection to terminals of an electrical circuit board. The body has an axis of symmetry extending between a central area of one of its end surfaces to a corresponding central area of the other of its end surfaces. Positive and negative electrodes are located on opposite sides, respectively, of the axis of symmetry on one of the end surfaces of the body, and negative and positive electrodes are located on opposite sides, respectively, of the axis of symmetry on the other end surface of the body. These electrodes are adapted for mating in position and polarity with positive and negative terminal pairs on a receiving electrical receptacle. In addition, these electrodes are positioned at locations on the end surfaces of the container package so that the positive terminals on the opposite end surfaces thereof are diagonally aligned with each other and the negative terminals on the opposite end surfaces are diagonally aligned with each other. The positive terminals are electrically connected internal to the package and the negative terminals are electrically connected internal to the package. Thus, both of two equally available planar orientations of the body within a compartment of an electrical circuit board are operative to forward bias the polarized component therein in the correct forward biased direction.

Another object of this invention is to provide a new and improved component package which is equally suitable for housing both polarized and non-polarized electronic components and is readily adapted for connection to electrical circuit boards in either of two permissible planar orientations.

Another object is to provide a new and improved package of the type described which eliminates the requirement for testing the package to insure that a particular planar orientation of the component exists within a circuit board receptacle or the like.

Another object is to provide a new and improved package of the type described which insures fail-safe connection of the component housed therein regardless of the planar orientation of the package, thereby eliminating the risk of failure or fire caused by a reverse biased polarized component.

Another object is to provide a new and improved package of the type described which is elegantly simple in its construction and which requires a minimum additional manufacturing cost and assembly effort in comparison to existing component package manufacturing processes.

A feature of this invention is the provision of a novel method for always properly biasing polarized electrical components having positive and negative end terminals when these components are inserted into a facing receptacle of a circuit board. This method comprises: (1) providing a package for and enclosing the component and having spaced positive voltage and negative voltage—receiving terminals on each opposite end of the package, and (2) electrically connecting the positive and negative end terminals of the component to both of the positive and negative voltage receiving terminals respectively on opposite ends of the package.

Another feature of this invention is the provision of a novel circuit for properly biasing polarized and non-polarized electrical components independent of their planar orientation in a facing receptacle of a circuit board or the like. This circuit comprises: (1) means including spaced positive and negative voltage-receiving terminals on both opposite ends of an enclosure which surrounds an electrical component and has opposite ends adapted to receive a bias voltage. The circuit further includes: (2) means electrically connecting the positive and negative voltage receiving terminals on both opposite ends of the enclosure to opposite ends of the electrical component, respectively, whereby the component is always correctly biased independent of the planar orientation of the enclosure within a facing receptacle.

The above summary of this invention together with its attendant advantages will become better understood in the following description of the accompany drawings:

BRIEF DESCRIPTION OF THE DRAWINGS

FIG. 1A is an isometric view of a surface-mount device of the prior art for biasing either a polarized or a non-polarized electronic component on a printed circuit board or the like.

Referring now to FIG. 1A, there is shown in an isometric view a surface-mount type device of the prior art which is designated generally 10 and typically includes a box shaped component package 12 which is mounted on the top surface of a printed circuit board 14. The printed circuit board 14 includes a pair of electrically conductive pads or terminals 16 and 18 thereon which may be typically obround in shape and spaced apart by a predetermined distance for mating with the corresponding L-shaped leads or terminals 20 and 22 on opposite ends of the component package 12. The terminals 16 and 18 are connected through the circuit board 14 with connections not shown in FIG. 1A to a source of energizing voltage.

FIG. 1A represents one basic three-dimensional surface-mount structure of the prior art wherein the component package 12 may include therein either a polarized or a non-polarized electronic component or components. These components may, for example, be electrolytic capacitors, diodes or other polarized devices which, for a particular circuit application, need to be biased by a voltage of a specific polarity.

Referring now to FIG. 1B, the component package 12 therein is shown in dotted line representation so as to reveal the typical connection of the biased component 24 which is directly connected between the two end terminals 20 and 22 as shown. The end terminals 20 and 22 will typically be secured to the mating obround conductive pads 16 and 18 by means of a solder paste 26. The solder paste 26 has been heated with localized heating at a certain elevated temperature in order to firmly secure the component package 12 in place in the position shown in FIG. 1B. The mounting of a component package 12 on a printed circuit board 14 in an upright position as shown in FIGS. 1A and 1B and the manufacturing processes for accomplishing same are well known in the surface mount technology and art. These processes are described in some detail in the above identified Mims article and U.S. Pat. No. 4,722,470.

Referring now to FIG. 1C, it is seen that the electrical component 24 is biased, plus-to-minus, by a single applied voltage having the polarity shown. Thus, unless the polarized component 24 of the prior art as illustrated in FIGS. 1A, 1B, and 1C is properly oriented in a specific planar orientation in the plane of the printed circuit board 14 and in the correct plus-to-minus position, it will become improperly reversed biased and will result in component breakdown and circuit failure as described above.

Referring now to FIG. 2A, there is shown a surface mount device 30 constructed in accordance with the present invention. This device 30 includes a component package 32 which is mounted as shown on the top surface of a printed circuit board 34 and includes dual contacts on each end surface of the package. These contacts are mounted on opposite sides of a longitudinal axis of symmetry 36 for the package 32 which includes a pair of opposing end surfaces 38 and 40. The end surface 40 includes a pair of positive and negative L-shaped end terminals 42 and 44 mounted on the near end of the package 32 and another pair of negative and positive terminals 46 and 48, respectively, mounted on the other end surface 38 of the package 32. In this arrangement, the diagonally positioned end terminals 44 and 46 located on opposite ends surfaces of the package 32 are also mounted on opposite sides of the axis of symmetry 36. Similarly, the positive end terminals 42 and 48 on the opposite end surfaces 40 and 38 of the package 32 are also mounted diagonally on opposite sides of the axis of symmetry 36. All of the end terminals 42, 44, 46, and 48 are connected respectively as shown to the obround conductive pads 50, 52, 54, and 56 on the top surface of the printed circuit board 34. The latter four pads 50, 52, 54, and 56 provide the required positive and negative voltage terminals at each end of the package 32.

Referring now to FIG. 2B, an electronic component 58 is shown inside the dotted line representation of the component package 32. This component 58 may for example be an electrolytic capacitor which will typically be connected at its opposite ends by way of electrical lead 60 and 62 to the positive and negative end terminals 42 and 44 on one end of the package 32. These same end terminals 42 and 44 are further connected by way of leads 66 and 64 to the L-shaped positive and negative terminals 46 and 48 on the other end surface 38 of the package 32. Thus, it will be appreciated by those skilled in the art that when the component package 32 is mounted in either of its two acceptable planar orientations on the facing surface of the substrate 34, and differing in orientation by 180°, either orientation will always properly bias the component 58 in the correct forward biased direction.

FIG. 2C shows a simple schematic diagram corresponding to the circuit connections in FIG. 2B where like reference numbers have been used to designate like component parts in the two figures. Thus, from FIG. 2C it is clearly seen that for either 180° orientation of this circuit in the plane of the drawing, the conductor 62 will always be connected to either one of the two positive bias terminals 42 or 48 and the conductor 60 will always be connected to either one of the two negative bias terminals 44 or 46. This connection feature means, of course, that the circuit board 34 must carry two (positive and negative) voltage pads 42 and 44 at one receptacle end and two (negative and positive) voltage pads 46 and 48 at the other receptacle end, with some attendant increase in manufacturing cost of the circuit board 34 with respect to the prior art of FIGS. 1A, 1B, and 1C. However, this additional increase in circuit board manufacturing costs is not that significant when considered in terms of requiring only a duplication of existing surface conductive trace material, bias terminal pads, and the associated electrical connections which must be made thereto. Such a relatively small increase in circuit board manufacturing costs will be far outweighed by the corresponding decrease in the costs of electrically testing these circuit boards due to the now-assured correct biasing of polarized components which are mounted thereon.

Figure 1A:
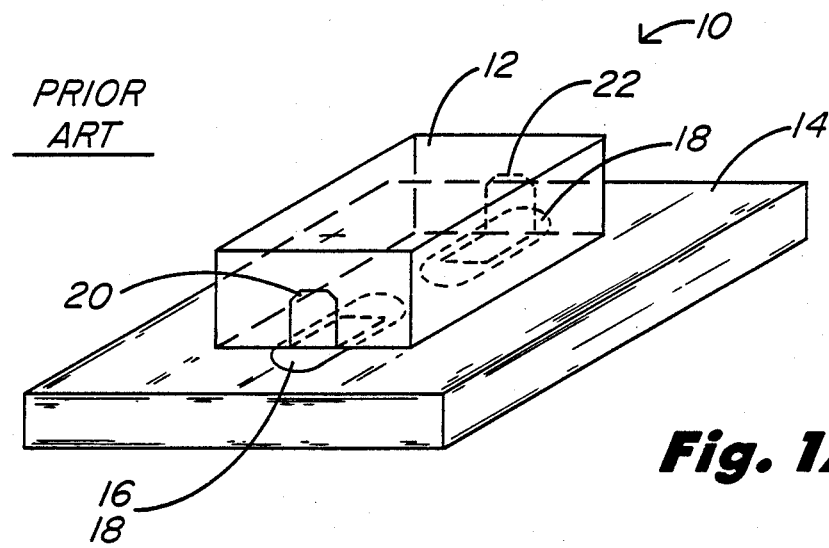
Figure 1B:
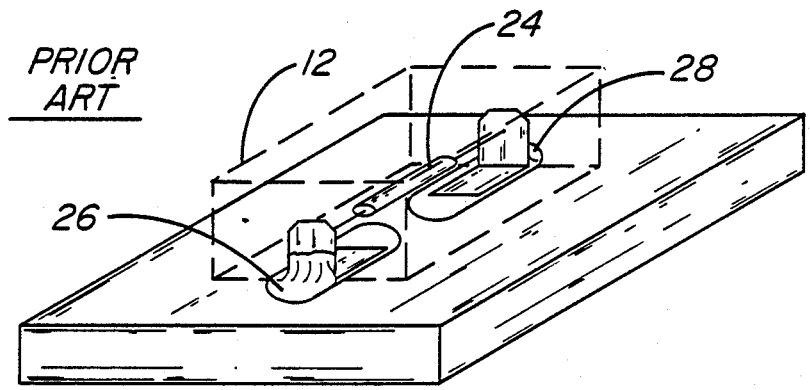
FIG. 1B is an isometric view showing the rectangular sided component package in FIG. 1A as a dotted line in order to reveal the electronic component mounted therein.
Figure 1C:
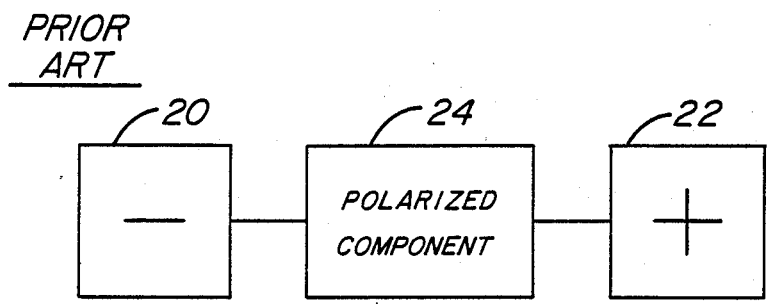
FIG. 1C is a simple electrical schematic diagram showing the series biasing of the electronic component in FIGS. 1A and 1B.
Figure 2A:
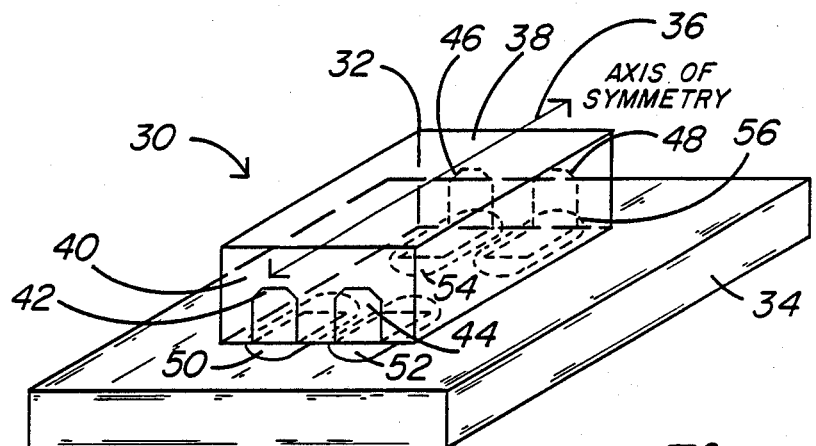
FIG. 2A is an isometric view of a surface-mount device according to the present invention and having positive and negative contacts on each end of the component-containing package.
Figure 2B:
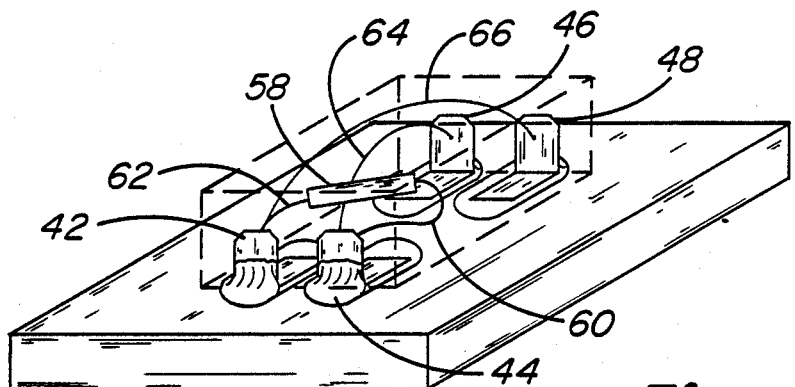
FIG. 2B is an isometric view corresponding to FIG. 2A and shows one exemplary circuit connection within the component containing package represented by dotted lines.
Figure 2C:
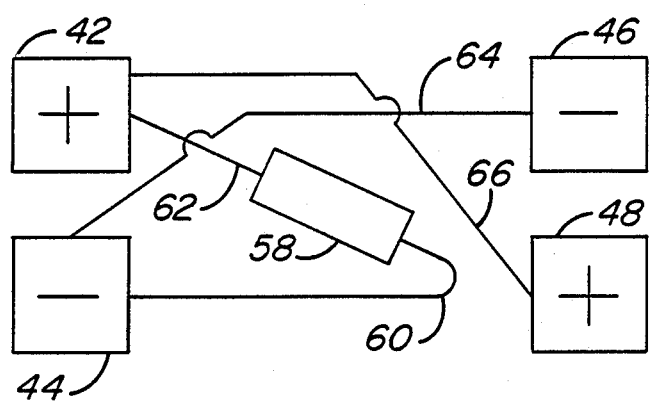
FIG. 2C is a simple electrical schematic diagram showing the biasing connections for the packing arrangement in FIG. 2B.

Thus, there has been described a novel surface mount component package, a method for constructing and fabricating the same, and a novel circuit means for connecting same as exemplified in FIG. 2C for interconnecting the component 58, such as an electrolytic capacitor, in a manner that will always provide a proper forward bias on the component 58 when it is mounted on the surface of a printed circuit board 34 or its equivalent.

Various modifications and adaptations may be made in the above described embodiment without departing from the scope of this invention. For example, while the above description is directed to a four terminal rotationally symmetrical implementation of this invention, the claims herein extend to other configurations (e.g. such as a configuration having three voltage-receiving terminals on each package end) which implement the same symmetry feature with different and additional terminal configurations. In addition, this invention includes applications which include the use of multiple electrical components located in rotationally symmetrical packages in order to achieve the same independence of orientation made possible by the embodiments described herein.

I claim:

1. A polarized electrical component package having a main body with first and second opposed spaced apart surfaces adapted for connecting with terminals of an electrical circuit board or compartment, said body having an axis of symmetry extending between a central area of one of said surfaces to a corresponding central area of the other of said surfaces, and positive and negative electrodes mounted on opposite sides, respectively, of said axis of symmetry on one of said surfaces of said body and negative and positive electrodes mounted, respectively, on opposite sides of said axis of symmetry on the other surface of said body and at locations so that positive electrodes on said opposing surfaces are diagonally aligned with each other with respect to said axis of symmetry and negative electrodes on said opposing surfaces are also diagonally aligned with each other, and said positive electrodes being electrically connected and said negative electrodes being electrically connected, whereby both of two equally available planar orientations displaced 180° are operative to provide a desired forward bias on said component when said component is inserted into a facing circuit board receptacle.

2. A method for biasing a package which contains electrical components therein and which has first and second opposite ends thereon to which electrical connections may be made, said method comprising the steps of:
   a. providing positive and negative voltage-receiving terminals on said first end of said package,
   b. providing negative and positive voltage-receiving terminals on said second end of said package, and
   c. mating said terminals on opposite ends of said package in both position and polarity to positive and negative terminal pairs which are spaced apart on a circuit board.

3. A method for manufacturing fail safe packages for housing either polarized or non-polarized electronic components, which comprises:
   (a) providing package end surfaces at opposite ends of an axis of symmetry for said package,
   (b) mounting positive voltage-receiving terminals on both of said end surfaces and on opposite sides of said axis of symmetry,
   (c) mounting negative voltage-receiving terminals on both of said end surfaces and on opposite sides of said axis of symmetry,
   (d) securing either a polarized or non-polarized electronic component within said package, and
   (e) electrically connecting one end of said component to both of said positive and negative voltage receiving terminals on both end surfaces of said package, whereby the component is properly biased when inserted into a positive voltage—negative voltage facing receptacle on a circuit board having terminal pairs matching said voltage receiving terminals on both end surfaces of said package, regardless of the planar orientation of said axis of symmetry.

4. A method for biasing a component package on the surface of a circuit board which includes:
   a. providing a board receptacle having positive and negative terminal pairs separated by the length of said package, b. providing positive and negative terminal pairs on each of two ends of said package, and
  c. mating the polarity of said terminal pairs on said package with said terminal pairs on said circuit board.

5. The method defined in claim 4 which further includes mounting at least one polarized component within said package, and connecting each of two ends of said component to both terminal pairs on each end of said package.

6. A method for properly biasing polarized electrical components having positive and negative end terminals when inserted into a facing receptacle independent of the planar orientation of said components, which comprises:
  (a) providing a package for and enclosing said component and having spaced positive voltage and negative voltage—receiving terminals on each opposite end of said package, and
  (b) electrically connecting said positive and negative end terminals of said polarized component to both of said positive and negative voltage receiving terminals on opposite ends of said package.

7. The method defined in claim 6 which includes providing a package receiving electrical receptacle which has positive and negative terminal pairs which match the polarity of said positive and negative receiving terminals on each opposite end of said package.

8. A circuit for properly biasing polarized and nonpolarized electrical components independent of their planar orientation in a facing receptacle of a circuit board or the like, comprising:
  (a) means including spaced positive and negative voltage-receiving terminals on both opposite ends of an enclosure which surrounds an electrical component with opposite ends adapted to receive a bias voltage, and
  (b) circuit means electrically connecting said positive and negative voltage receiving terminals on both opposite ends of said enclosure to said opposite ends of said electrical component, respectively, whereby said component is correctly biased independently of the planar orientation of said enclosure within said facing receptacle.

9. The circuit defined in claim 8 wherein said receptacle includes positive and negative terminal pairs for mating in both positions and polarity with said voltage receiving terminals on opposite ends of said enclosure.

* * * * *